(12) United States Patent
Sato

(10) Patent No.: US 10,115,802 B2
(45) Date of Patent: Oct. 30, 2018

(54) MANUFACTURING METHOD FOR COMPOUND SEMICONDUCTOR DEVICE

(71) Applicant: ADVANTEST CORPORATION, Nerima-ku, Tokyo (JP)

(72) Inventor: Taku Sato, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/591,697

(22) Filed: May 10, 2017

(65) Prior Publication Data
US 2017/0365689 A1    Dec. 21, 2017

(30) Foreign Application Priority Data

Jun. 20, 2016   (JP) .................................. 2016-121845

(51) Int. Cl.
| | | |
|---|---|---|
| H01L 29/66 | (2006.01) | |
| H01L 21/02 | (2006.01) | |
| H01L 21/306 | (2006.01) | |
| H01L 21/304 | (2006.01) | |
| H01L 21/3065 | (2006.01) | |
| H01L 21/18 | (2006.01) | |

(52) U.S. Cl.
CPC .... *H01L 29/66462* (2013.01); *H01L 21/0254* (2013.01); *H01L 21/187* (2013.01); *H01L 21/304* (2013.01); *H01L 21/3065* (2013.01); *H01L 21/30604* (2013.01)

(58) Field of Classification Search
CPC .......... H01L 29/66462; H01L 21/0254; H01L 21/187; H01L 21/3065; H01L 21/30604; H01L 21/304
See application file for complete search history.

(56) References Cited

U.S. PATENT DOCUMENTS

| | | | | |
|---|---|---|---|---|
| 9,437,672 B2* | 9/2016 | Okamoto | ............... | H01L 29/045 |
| 2009/0072272 A1 | 3/2009 | Suh et al. | | |
| 2009/0085065 A1 | 4/2009 | Mishra et al. | | |
| 2012/0001152 A1* | 1/2012 | Kim | ........................ | H01L 33/22 257/13 |
| 2012/0217505 A1* | 8/2012 | Ando | .................. | H01L 29/7783 257/76 |

(Continued)

FOREIGN PATENT DOCUMENTS

| | | |
|---|---|---|
| JP | 2012064643 A | 3/2012 |
| JP | 2016058512 A | 4/2016 |

OTHER PUBLICATIONS

C. Zhong et al., "Growth of N-polar GaN on vicinal sapphire substrate by metal organic chemical vapor deposition," Rare Metals 33.6; 2014, pp. 709-713.

(Continued)

*Primary Examiner* — Latanya N Crawford
(74) *Attorney, Agent, or Firm* — Cantor Colburn LLP

(57) ABSTRACT

A support substrate is bonded to a GaN epitaxial substrate including at least an electron transport layer and an electron supply layer grown on a growth substrate in the Ga-polar direction such that the support substrate faces the Ga-plane of the GaN epitaxial substrate. Furthermore, at least the growth substrate is removed from the GaN epitaxial substrate so as to expose an N-plane of the GaN epitaxial substrate. Subsequently, a semiconductor element is formed on the N-plane side.

11 Claims, 3 Drawing Sheets

(56) References Cited

U.S. PATENT DOCUMENTS

| | | |
|---|---|---|
| 2014/0227864 A1 | 8/2014 | Okuno et al. |
| 2014/0264379 A1 | 9/2014 | Kub et al. |
| 2015/0084104 A1* | 3/2015 | Ando .................. H01L 29/4236 |
| | | 257/288 |

OTHER PUBLICATIONS

U. Singisetti et al., "High-performance N-polar GaN enhancement-mode device technology," Semiconductor Science and Technology 28.7, 2013, pp. 1-13.

USPTO Final Office Action corresponding to U.S. Appl. No. 15/591,716; dated May 18, 2018.

USPTO Non-Final Office Action corresponding to U.S. Appl. No. 15/591,716; dated Oct. 3, 2017.

* cited by examiner

MANUFACTURING METHOD FOR COMPOUND SEMICONDUCTOR DEVICE

CROSS-REFERENCE TO RELATED APPLICATIONS

The present invention claims priority under 35 U.S.C. § 119 to Japanese Patent Application No.2016-121845, filed Jun. 20, 2016, the entire contents of which are incorporated herein by reference.

BACKGROUND OF THE INVENTION

1. Field of the Invention

The present invention relates to a compound semiconductor device.

2. Description of the Related Art

As substitutions for conventional silicon semiconductor devices, the development of nitride-compound semiconductor devices having the potential to operate at higher speed has been advanced. Among such compound semiconductor devices, in particular, GaN semiconductor devices are being actively researched and developed.

Such a GaN semiconductor material has a hexagonal crystal structure. With typical semiconductor devices formed of a hexagonal crystal semiconductor material, the c plane is employed. Such a GaN semiconductor material has two polar planes, i.e., the Ga-plane (Ga-polar) and the N-plane (N-polar). In general, it is difficult to grow such a crystal structure in the N-polar direction. Accordingly, as typical substrates, epitaxial substrates (wafers) are employed, which are obtained by growing such a crystal structure in the Ga-polar direction. FIG. 1A is a cross-sectional view of such a GaN semiconductor device.

A GaN semiconductor device 2r includes an epitaxial substrate 10. The epitaxial substrate 10 includes a growth substrate 12, a GaN layer 14, and an AlGaN layer 16. The GaN layer 14 is configured as a buffer layer and as an electron transport layer. The GaN layer 14 is formed on the growth substrate 12 such as a SiC substrate by means of crystal growth in the Ga-polar direction. Furthermore, the AlGaN layer 16 configured as an electron supply layer is formed on the GaN layer 14 by means of epitaxial growth. Such a GaN semiconductor device has a Ga-plane as a device surface. That is to say, semiconductor elements such as HEMTs (High Electron Mobility Transistors) or the like are formed on the Ga-plane side. The development of such a GaN semiconductor device 2r for practical use is being advanced. Examples of usage thereof include semiconductor devices employed in a wireless communication base station, and the like. In the present specification, a transistor (HEMT) formed in the GaN semiconductor device 2r shown in FIG. 1A will be referred to as the "Ga-plane HEMT".

In order to provide such a HEMT with a high operation speed, it is important to reduce access resistance. It can be assumed that such access resistance is equivalent to a series connection of a contact resistance component Rc and a semiconductor resistance component. With such a Ga-plane HEMT, a channel 18 is formed in the GaN layer 14. However, the AlGaN layer 16, which is configured as an electron supply layer, acts as a barrier that suppresses contact between the channel 18 and a drain electrode or otherwise a source electrode. This leads to a problem of a large contact resistance Rc.

As a substitution, a GaN Semiconductor device 2 has been proposed having a structure in which semiconductor elements are formed on the N-plane side (Singisetti, Uttam, Man Hoi Wong, and Umesh K. Mishra, "High-performance N-polar GaN enhancement-mode device technology", Semiconductor Science and Technology 28.7 (2013):074006). FIG. 1B is a cross-sectional view of such a GaN compound semiconductor device. In the present specification, a transistor formed in the GaN semiconductor shown in FIG. 1B will be referred to as the "N-plane HEMT", which is distinguished from the Ga-plane HEMT shown in FIG. 1A. A GaN semiconductor device 2s includes an epitaxial substrate 20. The epitaxial substrate 20 includes a growth substrate 22, a GaN layer 24, an AlGaN layer 26, and a GaN layer 28. The GaN layer 24 is configured as a buffer layer. The GaN layer 24 is formed on the growth substrate 22 such as a SiC substrate or the like by means of crystal growth in the N-polar direction. Furthermore, the AlGaN layer 26 configured as an electron supply layer is formed on the GaN layer 24 by means of epitaxial growth. Moreover, the GaN layer 28 configured as an electron transport layer is formed on the AlGaN layer 26 by means of epitaxial growth.

With such a GaN semiconductor device 2s, each channel 30 of a given HEMT is formed in the GaN layer 28. Accordingly, there is no AlGaN layer 26 that acts as an energy barrier between the channels 30 and the drain electrode and the source electrode formed on the surface layer side. Such an arrangement allows an ohmic contact to be provided, thereby allowing the contact resistance Rc to be reduced. Furthermore, the AlGaN layer 26 is arranged closer to the growth substrate 22 side than each channel 30. This leads to the formation of a back barrier structure, thereby suppressing the short-channel effect. Based on the reasons described above, in principle, such N-plane HEMTs have improved high-frequency characteristics as compared with Ga-plane HEMTs.

However, it is extremely difficult to provide such crystal growth in the N-polar direction as compared with crystal growth in the Ga-polar direction, as described in the Non-patent document (Zhong, Can-Tao, and Guo-Yi Zhang, "Growth of N-polar GaN on vicinal sapphire substrate by metal organic chemical vapor deposition", Rare Metals 33.6 (2014), pp709-713). At present, mass-produced N-plane HEMTs are not known. That is to say, such N-plane HEMTs are still at the basic research stage. In addition, manufactured crystal materials have a problem of poor quality. Accordingly, the N-plane HEMTs formed on such a crystal material have poor characteristics, which fall far short of the theoretical expected values.

SUMMARY OF THE INVENTION

The present invention has been made in view of such a situation. Accordingly, it is an exemplary purpose of an embodiment of the present invention to provide a GaN semiconductor device including transistor elements formed on its N-plane.

An embodiment of the present invention relates to a manufacturing method for a compound semiconductor device. With the manufacturing method, a semiconductor element is formed on an N-plane side of a GaN epitaxial substrate grown in a Ga-polar direction.

Such an embodiment does not require crystal growth in the N-polar direction, which is difficult as compared with crystal growth in the Ga-polar direction. Such an arrangement allows such an N-plane GaN semiconductor device to be manufactured in simple manner or with a low cost.

Also, a support substrate may be bonded to the GaN epitaxial substrate such that the support substrate faces a Ga-plane of the GaN epitaxial substrate. Such an arrangement allows the material employed for the support substrate to be selected without a need to give consideration to the crystal growth of such a GaN epitaxial substrate. This provides an improved degree of freedom in material selection. Examples of such bonding methods include thermocompression bonding, diffusion bonding, ultrasonic bonding, surface activated bonding, bonding by means of an adhesive agent, and the like.

Also, the N-plane of the GaN epitaxial substrate may be exposed by removing a growth substrate that functions as a base when the GaN epitaxial substrate is formed by means of crystal growth and a buffer layer formed on the growth substrate. Such an arrangement provides the N-plane with high crystal quality.

Also, the GaN epitaxial substrate may comprise an n-type conductive layer, a first GaN layer that functions as an electron transport layer, an electron supply layer, and a second GaN layer. Also, the GaN epitaxial substrate may have a multilayer structure in which an n-type conductive layer that functions as a contact layer, an electron transport layer, and an electron supply layer are multilayered in this order.

By forming a contact region on the N-plane of the n-type conductive layer for each drain electrode and source electrode, such an arrangement allows the contact resistance component, i.e., the access resistance, to be dramatically reduced. Such an arrangement provides transistors with high operation speed. In addition, by forming the n-type conductive layer on the GaN epitaxial substrate beforehand, such an arrangement does not require the regrowth process for forming the n-type conductive layer. This allows the manufacturing cost for such a compound semiconductor device to be further reduced.

Another embodiment of the present invention relates to a manufacturing method for a compound semiconductor device. The manufacturing method comprises: bonding a support substrate to a GaN epitaxial substrate having a multilayer structure comprising at least an electron transport layer and an electron supply layer multilayered on a growth substrate in a Ga-polar direction such that the support substrate faces a Ga-plane of the GaN epitaxial substrate; removing at least the growth substrate from the GaN epitaxial substrate so as to expose an N-plane of the GaN epitaxial substrate; and forming a semiconductor element on the N-plane side.

Also, the GaN epitaxial substrate may comprise the growth substrate, a buffer layer, an n-type conductive layer, a first GaN layer that functions as the electron transport layer, the electron supply layer, and a second GaN layer. The n-type conductive layer may comprise an n-type $In_xAl_yGa_zN$ layer ($1 \geq x, y, z \geq 0$, $x+y+z=1$).

By forming a contact region on the N-plane of the n-type conductive layer for each drain electrode and source electrode, such an arrangement allows the contact resistance component, i.e., the access resistance, to be dramatically reduced. Such an arrangement provides transistors with high operation speed. In addition, by forming the n-type conductive layer on the GaN epitaxial substrate beforehand, such an arrangement does not require the regrowth process for forming the n-type conductive layer. This allows the manufacturing cost for such a compound semiconductor device to be further reduced.

Also, in order to expose the N-plane, the growth substrate and the buffer layer may be removed.

Also, the growth substrate may be configured as a Si substrate.

Also, the growth substrate may be removed by means of at least one from among grinding and wet etching.

Also, the buffer layer may be removed by means of dry etching.

Also, the support substrate may be configured as a flexible substrate, an AlN substrate, a SiC substrate, a graphite substrate, a Cu substrate, or a Si substrate. Such an AlN substrate, SiC substrate, graphite substrate, and Cu substrate each have an advantage from the viewpoint of heat radiation performance. In a case in which the support substrate is configured as a Si substrate, a Si-CMOS circuit may be formed on the Si substrate. In this case, such an arrangement provides a hybrid device comprising CMOSs and GaN HEMTs with a low cost.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1A:
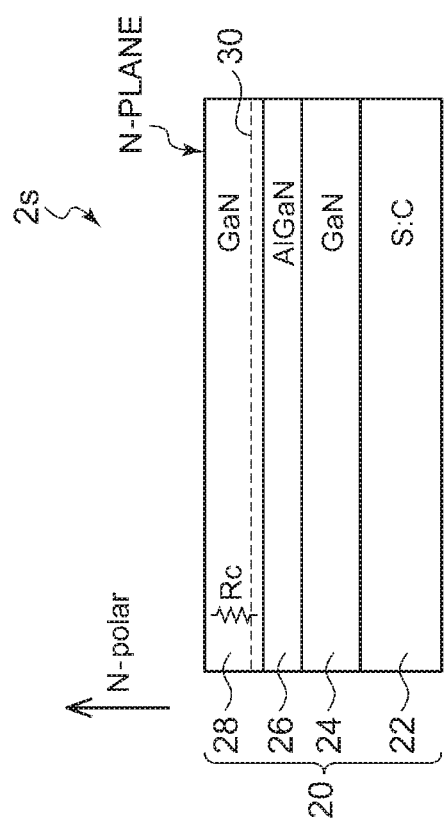
FIGS. 1A and 1B are cross-sectional diagrams each showing a GaN semiconductor device.

The invention will now be described based on preferred embodiments which do not intend to limit the scope of the present invention but exemplify the invention. All of the features and the combinations thereof described in the embodiment are not necessarily essential to the invention.

In some cases, the sizes (thickness, length, width, and the like) of each component shown in the drawings are expanded or reduced as appropriate for ease of understanding. The size relation between multiple components in the drawings does not necessarily match the actual size relation between them. That is to say, even in a case in which a given member A has a thickness that is larger than that of another member B in the drawings, in some cases, in actuality, the member A has a thickness that is smaller than that of the member B.

Figure 2:
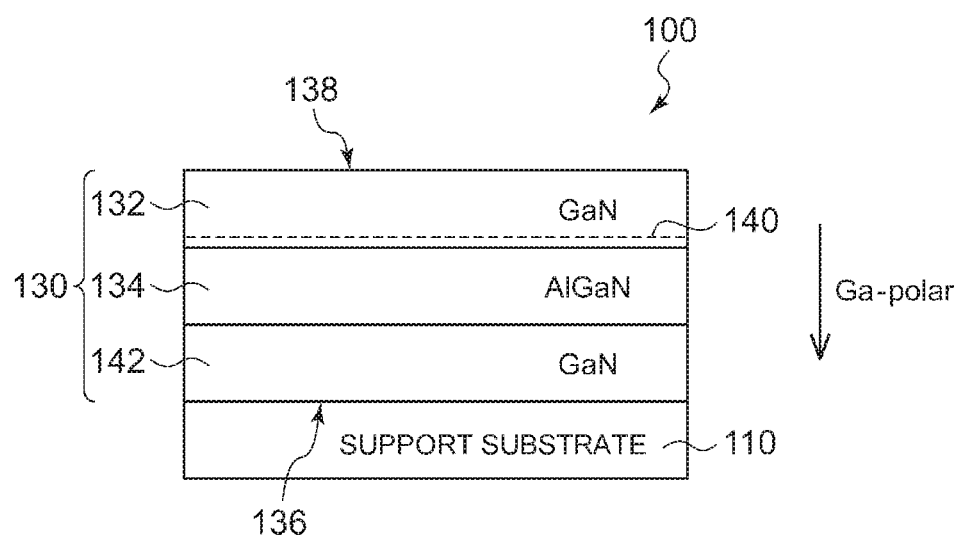
FIG. 2 is a cross-sectional diagram showing a GaN compound semiconductor device according to an embodiment.

FIG. 2 is a cross-sectional view of a GaN semiconductor device 100 according to an embodiment. The GaN semiconductor device 100 includes a support substrate 110 and a GaN epitaxial multilayer structure 130. The GaN epitaxial multilayer structure 130 includes at least an electron transport layer 132 and an electron supply layer 134. The GaN epitaxial multilayer structure 130 may further include a GaN layer 142. As an example, the electron transport layer 132 is configured as a GaN layer, and the electron supply layer 134 is configured as an AlGaN layer. However, the present invention is not restricted to such an arrangement.

The support substrate 110 and the GaN epitaxial multilayer structure 130 are bonded to each other such that the Ga-plane 136 of the GaN epitaxial multilayer structure 130 faces the support substrate 110. FIG. 2 shows an arrangement in which the Ga-plane 136 of the GaN epitaxial multilayer structure 130 is directly bonded to the support substrate 110. However, the present invention is not restricted to such an arrangement. Also, the Ga-plane 136 may be indirectly bonded to the support substrate 110 via another layer. Examples of such a bonding method include thermocompression bonding, diffusion bonding, ultrasonic bonding, surface activated bonding in which they are bonded to each other after the dangling bond structure on the substrate surface is exposed by means of plasma exposure in a vacuum, bonding by means of an adhesive agent, and the like. "Bonding" as used here represents bonding of a pair of members each configured as a separate member. That is to say, examples of "bonding" do not include heterojunctions formed in crystal growth.

Various kinds of circuit elements such as resistors, diodes, and transistors each configured as an HEMT or the like are formed on the N-plane 138 side of the GaN epitaxial multilayer structure 130. A channel 140 is formed in the electron transport layer 132. The structure of the circuit element may be designed using known techniques. Accordingly, description thereof will be omitted.

Figure 1B:
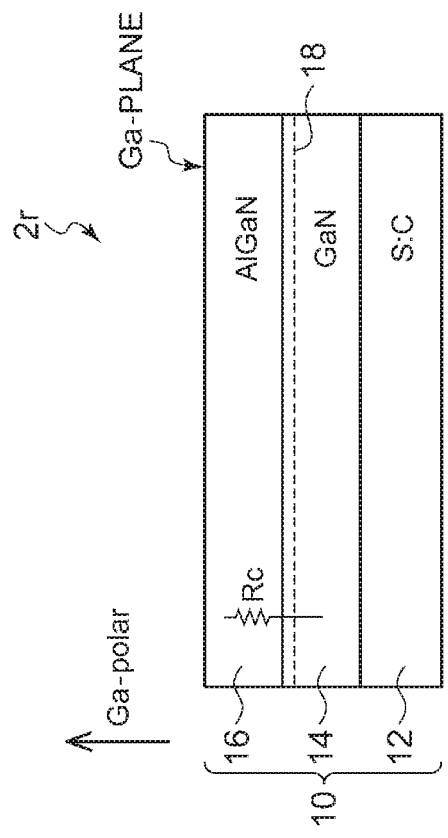

There are the following points of difference in the structure and the manufacturing method between the GaN semiconductor device 100 shown in FIG. 2 and the GaN semiconductor device 2s shown in FIG. 1B.

The first point of difference is as follows. That is to say, in the GaN semiconductor device 2s shown in FIG. 1B, the epitaxial substrate 20 is formed by means of crystal growth in the N-polar direction. In contrast, in the GaN semiconductor device 100 shown in FIG. 2, the GaN epitaxial multilayer structure 130 is formed by means of crystal growth in the Ga-polar direction. That is to say, it is a feature of the GaN semiconductor device 100 that such semiconductor elements are formed on the N-plane side of the GaN epitaxial substrate multilayered by means of crystal growth in the Ga-polar direction. The formation of the substrate shown in FIG. 1B requires crystal growth in the N-polar direction, which is difficult. In contrast, with such an arrangement shown in FIG. 2, the substrate is formed by means of crystal growth in the Ga-polar direction. This allows such an N-plane GaN semiconductor device to be manufactured in a simple manner or otherwise with a low cost. In addition, the crystal growth in the Ga-polar direction provides a high-quality crystal structure. Thus, such an arrangement provides further improved transistor characteristics than that shown in FIG. 1B.

More detailed description will be made regarding the first point of difference. That is to say, with such an arrangement shown in FIG. 1B, there is no atomic layer step structure, which is to be formed as the topmost surface in the crystal growth, as an interface between the GaN layer 24 and the growth substrate 22. In contrast, with such an arrangement shown in FIG. 2, there is an atomic layer step structure on the Ga-plane 136 side of the GaN epitaxial multilayer structure 130. In addition, with such an arrangement shown in FIG. 2, the threading dislocation density of the crystal structure becomes higher as it becomes closer to the N-plane 138 side. In contrast, with such an arrangement shown in FIG. 1B, the relation between them is the reverse of that provided by an arrangement shown in FIG. 1B.

The second point of difference is that the support substrate 110 shown in FIG. 2 does not function as a growth substrate used in the GaN crystal growth. That is to say, with such an arrangement shown in FIG. 1B, a GaN semiconductor compound is formed as a crystal structure on the growth substrate 22. Thus, there is a need to select a material of the growth substrate 22 such that there is a small difference in the crystal lattice between it and a GaN crystal structure. In contrast, with such an arrangement shown in FIG. 2, the material of the support substrate 110 can be selected without giving consideration to such a difference in the crystal lattice. Thus, various kinds of substrates formed of various kinds of materials having high heat radiation performance may be employed. Examples of such substrates that can be employed include AlN substrates, SiC substrates, Cu substrates, diamond substrates, and the like. Also, a flexible substrate may be employed, which provides the mounting of such a device with improved flexibility. Also, a Si substrate may be employed as the support substrate 110. In a case in which the support substrate 110 is configured as a Si substrate, a Si-CMOS circuit may be formed on the Si support substrate 110. Such an arrangement provides a hybrid device of a Si-CMOS circuit and a GaN HEMI circuit with a low cost.

The present invention encompasses various kinds of apparatuses, devices, and manufacturing methods that can be regarded as an arrangement shown in a cross-sectional view in FIG. 2, or otherwise that can be derived from the aforementioned description. That is to say, the present invention is not restricted to a specific configuration. More specific description will be made below regarding an example configuration and a manufacturing method for clarification and ease of understanding of the essence of the present invention and the circuit operation. That is to say, the following description will by no means be intended to restrict the technical scope of the present invention.

Figure 3A:
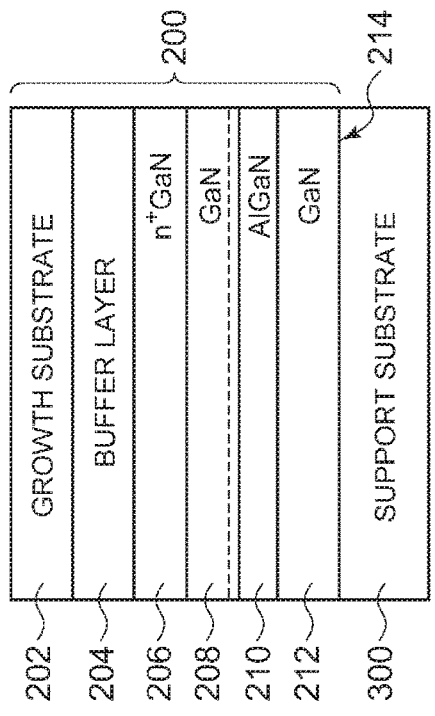
FIGS. 3A through 3D are diagrams each showing a manufacturing method for a GaN semiconductor device according to the embodiment.
Figure 3B:
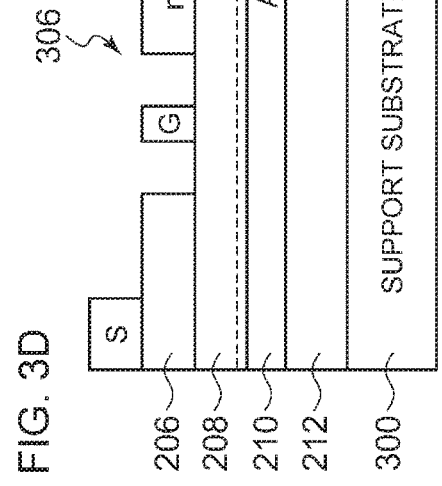

FIGS. 3A through 3d are diagrams showing a manufacturing method for an N-plane semiconductor device. First, as shown in FIG. 3A, a GaN epitaxial substrate (wafer) 200 is formed by means of crystal growth (epitaxial growth) in the Ga-polar direction without involving difficulty. The GaN epitaxial substrate 200 includes a growth substrate 202, a buffer layer 204, an n-type conductive layer 206, a first GaN layer 208, an AlGaN layer 210, and a second GaN layer 212. The buffer layer 204, the n-type conductive layer 206, the first GaN layer 208, the AlGaN layer 210, and the second GaN layer 212 are formed on the growth substrate 202 by means of epitaxial growth in the Ga-polar direction. A Ga-plane 214 is formed as the surface layer of the second GaN layer 212.

The first GaN layer 208 corresponds to the electron transport layer 132 shown in FIG. 2. The AlGaN layer 210 corresponds to the electron supply layer 134 shown in FIG. 2. The growth substrate 202 may be formed of the same material as that employed to form an epitaxial substrate of a Ga-plane GaN semiconductor device. That is to say, examples of such a material include Si, Sic, sapphire, and the like. However, such a material that can be employed is not restricted to such examples. As described later, the growth substrate 202 is removed in a downstream step. Accordingly, the growth substrate 202 is preferably formed of a low-cost material and/or of a material that can be easily removed. From this viewpoint, the growth substrate 202 may be configured as a Si substrate. The buffer layer 204 is configured as a GaN layer, for example. The n-type conductive layer 206 is configured as a contact layer that is interposed in order to provide a contact with the drain and the source of each transistor formed in the final stage.

Figure 3C:
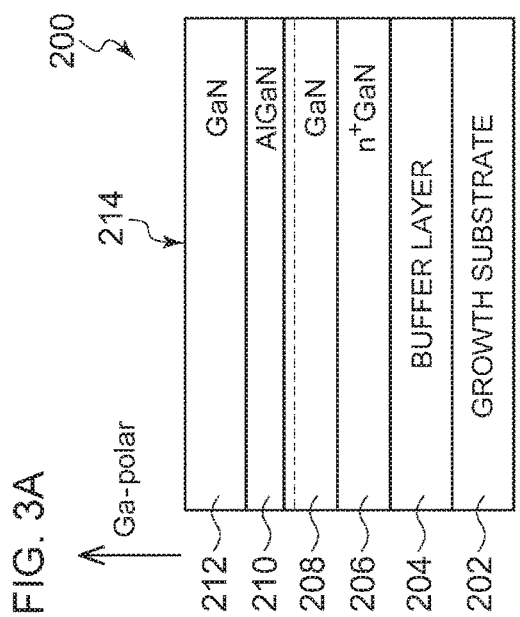
Figure 3D:
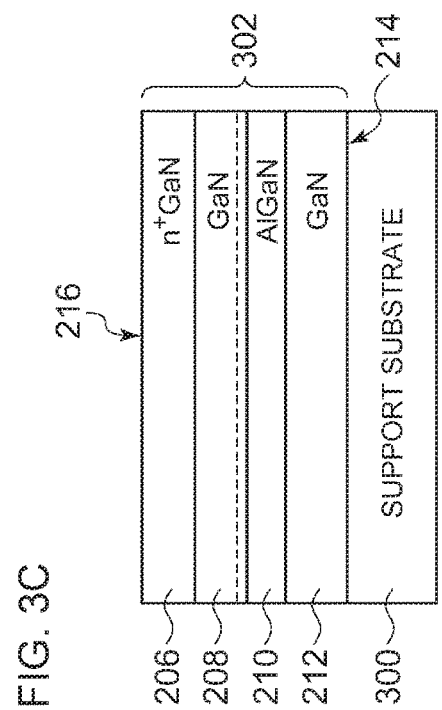

Subsequently, as shown in FIG. 3D, the support substrate 300 is bonded to the GaN epitaxial substrate 200 such that the support substrate 300 faces the Ga-plane 214 of the GaN epitaxial substrate 200. The support substrate 300 corresponds to the support substrate 110 shown in FIG. 2. The substrate bonding method is not restricted in particular.

Subsequently, as shown in FIG. 3C, the growth substrate 202 and the buffer layer 204 of the GaN epitaxial substrate 200 are removed. As a result, the N-plane 216 of the n-type conductive layer 206 is exposed. A remaining multilayer structure 302 includes the n-type conductive layer 206, the first GaN layer 208, the AlGaN layer 210, and the second GaN layer 212, which corresponds to the GaN epitaxial multilayer structure 130 shown in FIG. 2.

For example, the growth substrate 202 is removed by means of at least one from among grinding and wet etching. In a case in which the growth substrate 202 is configured as a Si substrate, after the growth substrate 202 is ground so as to reduce its thickness, the remaining portion of the growth substrate 202 may be removed by wet etching. Subsequently, the buffer layer 204 may be removed by means of dry etching using an endpoint detection function.

Subsequently, as shown in FIG. 3D, circuit elements such as HEMTs or the like are formed on the N-plane 216 side of the multilayer structure 302. FIG. 3D shows an arrangement in which HEMTs are formed. Specifically, the n-type conductive layer 206 is etched in each gate region, so as to form each gate electrode (G). Furthermore, a drain electrode (D) and a source electrode (S) are respectively formed in the drain region and the source region on the n-type conductive layer 206. The n-type conductive layer 206 may be configured as an n-type GaN layer.

As shown in FIG. 3D, such an arrangement provides the N-plane 216 of the n-type conductive layer 206 with a contact with the drain electrode (D) and the source electrode (S). This allows the contact resistance component, i.e., the access resistance, to be dramatically reduced, thereby providing the HEMTs with high operation speed. That is to say, with such an arrangement, the n-type conductive layer 206 that functions as a contact layer is directly layered on the first GaN layer 208. Such an arrangement provides low contact resistance of 0.1 Ωmm or less.

With conventional semiconductor device manufacturing methods, formation of an ohmic electrode requires heat treatment at a temperature of 500° C. to 900° C. (ohmic alloy formation). In contrast, with the present embodiment, the n-type conductive layer 206, which is a degenerate semiconductor, is formed as a contact layer. Accordingly, the potential barrier formed between a metal electrode and the n-type conductive layer has a dramatically reduced thickness in the growth direction. Thus, such an arrangement does not require such a high-temperature ohmic alloy formation process to allow an electron to tunnel through such a potential barrier, thereby providing low contact resistance. That is to say, the ohmic alloy formation process can be omitted.

In a case in which there is no n-type conductive layer 206, the material of the ohmic electrode is restricted to an Al material. In contrast, in a case of providing such an n-type conductive layer 206, such an arrangement relaxes the restrictions imposed on the material of the ohmic electrode.

Furthermore, as shown in FIG. 3A, by forming the n-type conductive layer 206 on the GaN epitaxial substrate 200 beforehand, such an arrangement does not require the regrowth process for forming the contact layer (n-type conductive layer 206). Such an arrangement allows the manufacturing cost required for such a compound semiconductor device to be further reduced.

With such an arrangement, in the manufacturing step for forming the GaN epitaxial substrate 200, the electron transport layer 132 is formed after the crystal growth for forming the electron supply layer 134. This provides a high-quality crystal structure. That is to say, in a case in which the epitaxial substrate 20 shown in FIG. 1B is employed, after the electron supply layer is formed by means of crystal growth, the GaN layer that functions as an electron transport layer is formed by means of crystal growth. With such an arrangement, the temperature employed in the crystal growth in which the electron transport layer is formed is restricted. As an example, in a case in which the electron supply layer is configured as an InAlN layer (optimum crystal growth temperature of 700° C.), there is a need to perform the subsequent crystal growth at a temperature on the order of 700° C. This leads to degraded crystal quality of the GaN layer that functions as an electron transport layer (optimum crystal growth temperature of 1000° C.). In contrast, with the present embodiment, after the first GaN layer 208 which functions as an electron transport layer is formed by means of crystal growth, the electron supply layer (InAlN layer) is formed by means of crystal growth. Such an arrangement allows the first GaN layer 208 to be formed by crystal growth in an optimum temperature condition for the GaN layer. Thus, such an arrangement provides a high-quality crystal structure.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made with reference to FIGS. 3A through 3D regarding the manufacturing method in which, after the GaN epitaxial substrate 200 is bonded to the support substrate 300, the growth substrate 202 and the buffer layer 204 are removed. However, the present invention is not restricted to such an arrangement. That is to say, after the growth substrate 202 and the buffer layer 204 are removed such that the N-plane 216 is exposed, the GaN epitaxial substrate 200 may be bonded to the support substrate 300.

In the manufacturing step for forming the GaN epitaxial substrate 200 shown in FIG. 3A, an intermediate layer configured as a several-atom layer having a small thickness such as a metal layer (or an insulating layer or otherwise a semiconductor layer) may be interposed between the buffer layer 204 and the n-type conductive layer 206. Such an arrangement allows the buffer layer 204 to be removed from the n-type conductive layer 206 by cleavage in a simple manner. The N-plane 216 may be defined by cleavage such that it is exposed.

As shown in FIG. 3D, the layers that are lower than the second GaN layer 212 have no effect on the structure of each HEMT. Thus, yet another layer may be interposed between the second GaN layer 212 and the support substrate 300. In other words, the GaN epitaxial substrate 200 shown in FIG. 3A may include another layer that is further above the second GaN layer 212. In this case, the Ga-plane 214 of the second GaN layer 212 and the support substrate 300 may be coupled in an indirect contact state. For example, with such an arrangement shown in FIG. 3A, a layer may be formed on the second GaN layer 212 such that it functions as an adhesive agent when the second GaN layer 212 is bonded to the support substrate 300. Also, an additional layer may be formed so as to provide improved bonding strength. Also, a sacrificial layer such as a BN (boron-nitride) layer or the like may be interposed between the second GaN layer 212 and the support substrate 300.

Description has been made in the embodiment regarding an example in which the electron supply layer 134 is configured as an AlGaN layer. However, the present invention is not restricted to such an arrangement. Also, the electron supply layer 134 may be configured as an InAlN layer or an AlN layer, for example.

The n-type conductive layer 206 employed as a contact layer shown in FIG. 3 may include a layer, which is generally referred to as an n-type $In_xAl_yGa_zN$ layer ($1 \geq x$, y, $z \geq 0$, $x+y+z=1$). Also, the n-type conductive layer 206 may have a so-called three-layer cap structure. Also, the n-type conductive layer 206 may have a multilayer structure comprising an n-type GaN layer, an i-type AlN layer, and an n-type GaN layer.

Description has been made with reference to FIG. 3D regarding a D-mode (depression type, i.e., normally-on type) HEMT. Also, such an HEMT may be configured as an E-mode HEMT using known or prospectively available techniques. Also, in connection with the gate electrode, a device having a MIS (Metal-Insulator-Semiconductor) structure may be formed.

Description has been made with reference to FIGS. 3A through 3D regarding the manufacturing method that requires no crystal regrowth process. However, the present invention is not restricted to such an arrangement. For example, a GaN epitaxial substrate including no n-type conductive layer 206 may be formed. Furthermore, after the growth substrate 202 and the buffer layer 204 are removed such that the N-plane of the first GaN layer 208 is exposed, the n-type conductive layer 206 may be formed by crystal regrowth. Subsequently, the drain electrodes (D) and the source electrodes (S) may be formed on the n-type conductive layer 206. Alternatively, ohmic electrodes may be formed without forming such an n-type conductive layer 206.

While the preferred embodiments of the present invention have been described using specific terms, such description is for illustrative purposes only, and it is to be understood that changes and variations may be made without departing from the spirit or scope of the appended claims.

What is claimed is:

1. A manufacturing method for a compound semiconductor device, wherein a semiconductor element is formed on an N-plane side of a GaN epitaxial substrate grown in a Ga-polar direction,
   wherein the GaN epitaxial substrate has a multilayer structure in which an n-type conductive layer, a first GaN layer that functions as an electron transport layer, an electron supply layer, and a second GaN layer are multilayered in this order in the Ga-polar direction.

2. The manufacturing method according to claim 1, wherein a support substrate is bonded to the GaN epitaxial substrate such that the support substrate faces a Ga-plane of the GaN epitaxial substrate.

3. The manufacturing method according to claim 1, wherein the N-plane of the GaN epitaxial substrate is exposed by removing a growth substrate that functions as a base when the GaN epitaxial substrate is formed by means of crystal growth and a buffer layer formed on the growth substrate.

4. A manufacturing method for a compound semiconductor device, wherein a semiconductor element is formed on an N-plane side of a GaN epitaxial substrate grown in a Ga-polar direction, wherein the GaN epitaxial substrate has a multilayer structure in which an n-type conductive layer that functions as a contact layer, a GaN layer that functions as an electron transport layer, and an electron supply layer are multilayered in this order in the Ga-polar direction.

5. A manufacturing method for a compound semiconductor device comprising:
   bonding a support substrate to a GaN epitaxial substrate, wherein the GaN epitaxial substrate has a multilayer structure in which at least a growth substrate, an electron transport layer and an electron supply layer are multilayered in this order in a Ga-polar direction, and wherein the support substrate faces a Ga-plane of the GaN epitaxial substrate;
   removing at least the growth substrate from the GaN epitaxial substrate so as to expose an N-plane of the GaN epitaxial substrate; and
   forming a semiconductor element on the N-plane side.

6. The manufacturing method according to claim 5, wherein the GaN epitaxial substrate comprises the growth substrate, a buffer layer, an n-type conductive layer, a first GaN layer that functions as the electron transport layer, the electron supply layer, and a second GaN layer.

7. The manufacturing method according to claim 6, wherein, in order to expose the N-plane, the growth substrate and the buffer layer are removed.

8. The manufacturing method according to claim 5, wherein the growth substrate is configured as a Si substrate.

9. The manufacturing method according to claim 5, wherein the growth substrate is removed by means of at least one from among grinding and wet etching.

10. The manufacturing method according to claim 6, wherein the buffer layer is removed by means of dry etching.

11. The manufacturing method according to claim 5, wherein the support substrate comprises at least one from among a flexible substrate, an AlN substrate, a SiC substrate, a graphite substrate, a Cu substrate, and a Si substrate.

* * * * *